(12) United States Patent
Tsuchiya

(10) Patent No.: US 8,648,302 B2
(45) Date of Patent: Feb. 11, 2014

(54) THERMAL DETECTOR, THERMAL DETECTION DEVICE, ELECTRONIC INSTRUMENT, AND THERMAL DETECTOR MANUFACTURING METHOD

(75) Inventor: Yasushi Tsuchiya, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 238 days.

(21) Appl. No.: 13/329,518

(22) Filed: Dec. 19, 2011

(65) Prior Publication Data

US 2012/0161006 A1 Jun. 28, 2012

(30) Foreign Application Priority Data

| Dec. 22, 2010 | (JP) | 2010-286334 |
| Dec. 27, 2010 | (JP) | 2010-289491 |
| Dec. 27, 2010 | (JP) | 2010-289492 |
| Jan. 24, 2011 | (JP) | 2011-012060 |
| Feb. 23, 2011 | (JP) | 2011-036886 |

(51) Int. Cl.
*G01J 5/00* (2006.01)

(52) U.S. Cl.
USPC ......... 250/338.3; 250/339; 250/340; 250/341

(58) Field of Classification Search
USPC ...................................... 250/338.3, 339, 341
See application file for complete search history.

(56) References Cited

U.S. PATENT DOCUMENTS

| 5,686,779 | A | * | 11/1997 | Vig | 310/366 |
| 6,133,572 | A | * | 10/2000 | Cunningham | 250/339.03 |
| 6,249,001 | B1 | * | 6/2001 | Sauer et al. | 250/338.1 |
| 2001/0010360 | A1 | * | 8/2001 | Oda | 250/338.1 |
| 2004/0140428 | A1 | * | 7/2004 | Ionescu et al. | 250/338.1 |
| 2007/0108383 | A1 | * | 5/2007 | Combes et al. | 250/338.1 |
| 2010/0243892 | A1 | * | 9/2010 | Dupont | 250/332 |

FOREIGN PATENT DOCUMENTS

| JP | 2000-019010 A | 1/2000 |
| JP | 3339276 B2 | 10/2002 |
| JP | 2004-279103 A | 10/2004 |
| JP | 2010-127891 A | 6/2010 |

\* cited by examiner

*Primary Examiner* — David Porta
*Assistant Examiner* — Taeho Jo
(74) *Attorney, Agent, or Firm* — Global IP Counselors, LLP

(57) ABSTRACT

A thermal detector includes a substrate; a support member supported on the substrate with a cavity interposed therebetween; a heat-detecting element formed on the support member; a first light-absorbing layer formed on the heat-detecting element and the support member so as to be in contact with the heat-detecting element; and a second light-absorbing layer formed on the first light-absorbing layer so as to be in contact with the first light-absorbing layer. The second light-absorbing layer has a higher refractive index than the first light-absorbing layer. A first wavelength resonates between a surface of the support member and an upper surface of the second light-absorbing layer, and a second wavelength, which is different from the first wavelength, resonates between an interface, at which the first light-absorbing layer and the second light-absorbing layer are in contact with each other, and the upper surface of the second light-absorbing layer.

20 Claims, 8 Drawing Sheets

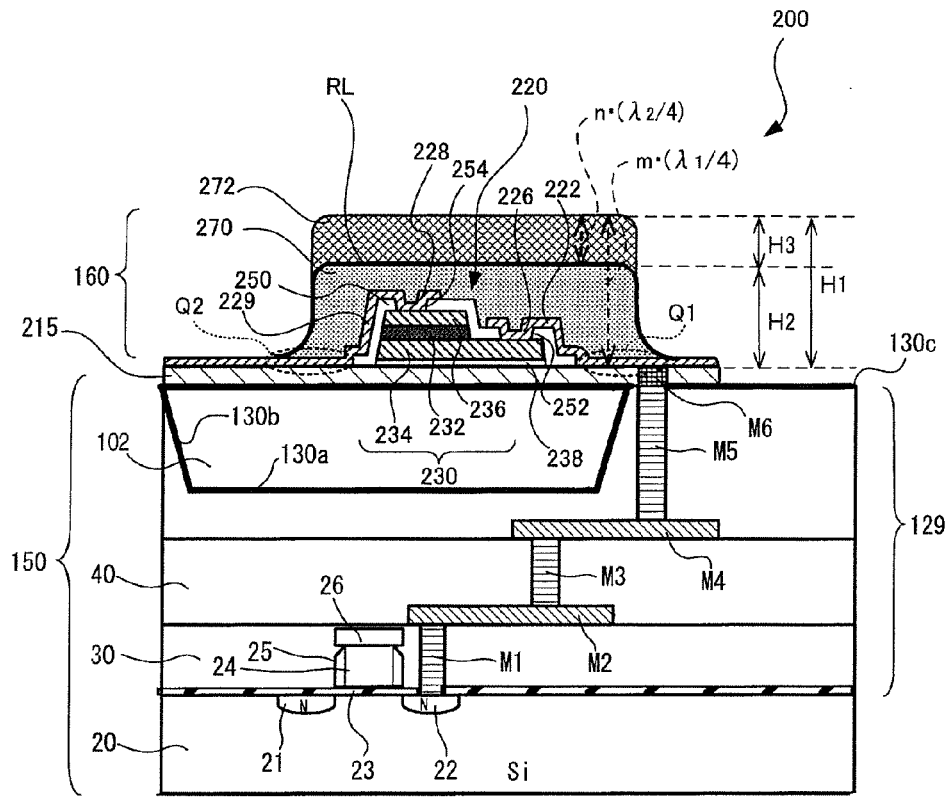
Fig. 1A
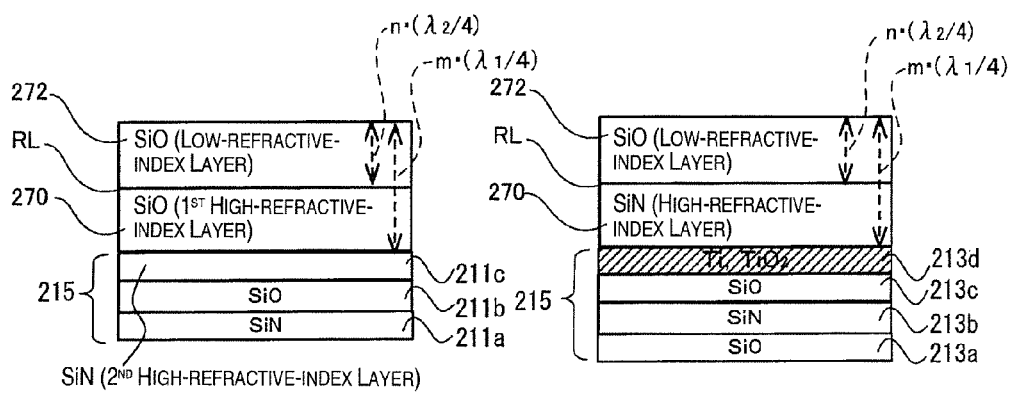
Fig. 1B  Fig. 1C

P1: RESONANCE PEAK OF FIRST RESONATOR
P2: RESONANCE PEAK OF SECOND RESONATOR
P3: DETECTION SENSITIVITY OF THERMAL DETECTOR

→ : HEAT COLLECTION BY WIRING

THERMAL DETECTOR, THERMAL DETECTION DEVICE, ELECTRONIC INSTRUMENT, AND THERMAL DETECTOR MANUFACTURING METHOD

CROSS-REFERENCE TO RELATED APPLICATIONS

This application claims priority to Japanese Patent Application No. 2010-286334 filed on Dec. 22, 2010, Japanese Patent Application No. 2010-289491 filed on Dec. 27, 2010, Japanese Patent Application No. 2010-289492 filed on Dec. 27, 2010, Japanese Patent Application No. 2011-012060 filed on Jan. 24, 2011 and Japanese Patent Application No. 2011-036886 filed on Feb. 23, 2011. The entire disclosures of Japanese Patent Application Nos. 2010-286334, 2010-289491, 2010-289492, 2011-012060 and 2011-036886 are hereby incorporated herein by reference.

BACKGROUND

1. Technical Field

The present invention relates to a thermal detector, a thermal detection device, an electronic instrument, and a thermal detector manufacturing method.

2. Related Art

Thermal detection devices are known as light sensors. Thermal detectors absorb light that has been emitted from an object in a light-absorbing layer, convert the light to heat, and measure the change in temperature with a heat-detecting element. Thermal detectors include thermopiles that directly detect the increase in temperature accompanying light absorption, pyroelectric-type elements that detect a change in electrical polarity, and bolometers that detect the increase in temperature as a change in resistance. Thermal detectors have a characteristically wide wavelength range over which measurements can be made. In recent years, semiconductor fabrication technologies (e.g., MEMS technologies) have been used, and the production of smaller-scale thermal detectors has been attempted.

In order to enhance the detection accuracy and improve the responsiveness of a thermal detector, it is important to generate heat in the light-absorbing layer in an efficient manner, and to transmit the heat generated in the light-absorbing layer to the heat-detecting element in an efficient manner.

An example of a structure of a pyroelectric-type infrared sensor is described in, e.g., Japanese Laid-Open Patent Application Publication No. 2004-279103. In the example described in this publication, an insulating film for carrying a pyroelectric element is formed on a cavity, and a pyroelectric element is formed on the insulating film. The pyroelectric element has a structure in which a pyroelectric material is sandwiched between upper and lower electrodes.

An example in which an optical resonator is configured in an infrared sensor is described in, e.g., Japanese Laid-Open Patent Application Publication No. 2010-127891. In the example described in this publication, in a bolometer-type infrared sensor, the distance between a reflective film and a heat-sensitive film is set to an integer multiple of $\lambda/4$ (where $\lambda$ is the wavelength of light), thereby causing resonation of light and enhancing the efficiency of light absorption by the heat-sensitive film.

SUMMARY

According to the technique described in Japanese Laid-Open Patent Application Publication No. 2010-127891, the effect of light resonance is only obtained in relation to wavelengths near wavelength $\lambda$, from among light included in incident light.

According to at least one aspect of the present invention, it is possible to, e.g., expand a wavelength band within which light is detected by a thermal detector, using a simple configuration.

A thermal detector according to one aspect of the present invention includes a substrate, a support member, a heat-detecting element, a first light-absorbing layer, and a second light-absorbing layer. The support member is supported on the substrate so that a cavity is formed between the substrate and the support member. The heat-detecting element is formed on the support member. The first light-absorbing layer contacts the heat-detecting element and formed on the heat-detecting element and the support member. The second light-absorbing layer contacts the first light-absorbing layer and formed on the first light-absorbing layer, the second light-absorbing layer having a higher refractive index than that of the first light-absorbing layer. The support member, the first light-absorbing layer and the second light-absorbing layer are arranged such that a first wavelength resonates between a surface of the support member and an upper surface of the second light-absorbing layer, and a second wavelength, which is different from the first wavelength, resonates between an interface, at which the first light-absorbing layer and the second light-absorbing layer are in contact with each other, and the upper surface of the second light-absorbing layer.

According to the aspect described above, two optical resonators having different resonance wavelengths are configured. Since resonance peaks occur at two different wavelengths, it is possible to expand the wavelength band (wavelength width) within which light can be detected by the thermal detector.

The first optical resonator corresponding to the first wavelength $\lambda 1$ is formed between the surface of the support member and the upper surface of the second light-absorbing layer. Some of the incident light that is incident on the region of the support member in plan view is absorbed by at least one of the first light-absorbing layer and the second light-absorbing layer; some of the light is reflected by the interface between the first light-absorbing layer and the second light-absorbing layer; some of the light that is not absorbed by the second light-absorbing layer reaches the surface of the support member; and some of the light that reaches the surface of the support member is reflected. Some of the light that is reflected by the surface of the support member is absorbed by at least one of the first light-absorbing layer and the second light-absorbing layer. Light that is not absorbed is reflected by the upper surface of the second light-absorbing layer and caused to travel back downwards. The operation above is repeated, resulting in resonance of the first wavelength $\lambda 1$.

The incident light, which has a wavelength of $\lambda 1$, and the light reflected by the surface of the support member, which has a wavelength of $\lambda 1$, mutually interfere and cancel each other out, and the effective absorption rate in the first light-absorbing layer and the second light-absorbing layer increases. In other words, configuring the first light-absorbing layer makes it possible to increase the effective absorption rate in each of the light-absorbing layers.

Also, when a second wavelength is represented by $\lambda 2$, the second optical resonator corresponding to the second wavelength $\lambda 2$, which is different from the first wavelength $\lambda 1$, is formed between the interface at which the first light-absorbing layer and the second light-absorbing layer are in contact with each other (may also be referred to as the lower surface of the second light-absorbing layer), and the upper surface of the second light-absorbing layer.

As described above, some of the incident light that is incident on the region of the support member in plan view is reflected at the interface between the first light-absorbing layer and the second light-absorbing layer. Since the refractive index of the second light-absorbing layer is higher than the refractive index of the first light-absorbing layer, light is reliably reflected at the interface between the first light-absorbing layer and the second light-absorbing layer. Light that is reflected at the interface is absorbed by the second light-absorbing layer. Light that is not absorbed is reflected by the upper surface of the second light-absorbing layer and caused to travel back downwards. The operation above is repeated, resulting in resonance of the second wavelength $\lambda 2$.

The incident light, which has a wavelength of $\lambda 2$, and the light reflected by the interface between the first light-absorbing layer and the second light-absorbing layer (i.e., the lower surface of the second light-absorbing layer), which has a wavelength of $\lambda 2$, thereby mutually interfere and cancel each other out, making it possible to increase the effective absorption rate in the second light-absorbing layer.

According to the aspect described above, two optical resonators that resonate with respect to different wavelengths are configured using the surface of the support member, the interface at which the first light-absorbing layer and the second light-absorbing layer are in contact with each other, and the upper surface of the second light-absorbing layer. Therefore, the structure is simple, and the thermal detector can be readily manufactured.

Also as described above, resonance peaks occur at two different wavelengths, making it possible to expand the wavelength band (wavelength width) of light that can be detected by the thermal detector. Therefore, the detection wavelength band of the thermal detector can be expanded using, e.g., a simple configuration.

According to another aspect of the thermal detector of the present invention, the surface of the support member and the upper surface of the second light-absorbing layer are preferably parallel to each other, the interface at which the first light-absorbing layer and the second light-absorbing layer are in contact with each other and the upper surface of the second light-absorbing layer are preferably parallel to each other, a distance between the surface of the support member and the upper surface of the second light-absorbing layer preferably satisfies a relationship $m \cdot (\lambda 1/4)$, where m is an integer equal to or greater than 1 and $\lambda 1$ is the first wavelength, and a distance between the interface at which the first light-absorbing layer and the second light-absorbing layer are in contact with each other and the upper surface of the second light-absorbing layer preferably satisfies a relationship $n \cdot (\lambda 2/4)$, where n is an integer equal to or greater than 1 and $\lambda 2$ is the second wavelength.

According to the aspect described above, the film thickness of each of the first light-absorbing layer and the second light-absorbing layer is adjusted, and two optical resonators having different resonance wavelengths are configured. According to the aspect described above, so-called $\lambda/4$ optical resonators are used for the first optical resonator and the second optical resonator. If the first wavelength is represented by $\lambda 1$, the film thickness of each of the first light-absorbing layer and the second light-absorbing layer is adjusted so that the distance between the surface of the support member and the upper surface of the second light-absorbing layer satisfies a relationship $m \cdot (\lambda 1/4)$ (where m is an integer equal to or greater than 1). In other words, the total film thickness of the first light-absorbing layer and the second light-absorbing layer is adjusted to a thickness that satisfies the relationship $m \cdot (\lambda 1/4)$ (where m is an integer equal to or greater than 1).

Also, if the second wavelength is represented by $\lambda 2$, the distance between the lower surface of the second light-absorbing layer and the upper surface of the second light-absorbing layer (i.e., the film thickness of the second light-absorbing layer) is set to $n \cdot (\lambda 2/4)$, whereby the second optical resonator is configured.

According to the aspect described above, the thermal detector can be readily manufactured, since only the film thicknesses of two light-absorbing layers need to be adjusted.

According to the aspect described above, the surface of the support member and the upper surface of the second light-absorbing layer are parallel, and the interface at which the first light-absorbing layer and the second light-absorbing layer are in contact with each other and the upper surface of the second light-absorbing layer are parallel. These surfaces are used to configure optical resonators that resonate with respect to two different wavelengths. It is thereby possible to increase the efficiency of light absorption in the two light-absorbing layers using a simple configuration.

According to the another aspect of the thermal detector according to the present invention, the surface of the support member is preferably a surface of a layer of a material having a higher refractive index than that of the first light-absorbing layer.

According to the aspect described above, a material layer having a higher refractive index than that of the first light-absorbing layer is used as a material layer forming the surface of the support member. A material layer having a higher refractive index than that of the first light-absorbing layer is regarded as a constituent element of the support member, and the surface of the material layer is used as a reflection surface. The corresponding material layer may form the entire support member. Alternatively, the corresponding material layer may form an uppermost layer (i.e., a layer nearest the first light-absorbing layer), from among the plurality of laminated material layers forming the support member.

Light can thereby be reliably reflected at the surface of the support member. Optical resonance due to the first optical resonator thereby occurs more readily.

According to another aspect of the thermal detector according to the present invention, the surface of the support member is preferably a surface of a layer of a material having light-reflecting characteristics such that light is reflected.

According to the aspect described above, a material layer having light-reflecting characteristics such that light is reflected is regarded as a constituent element of the support member, and the surface of the material layer is used as a reflection surface. The corresponding material layer may form the entire support member. Alternatively, the corresponding material layer may form an uppermost layer (i.e., a layer nearest the first light-absorbing layer), from among the plurality of laminated material layers forming the support member.

It thereby becomes possible to, e.g., cause a majority of light reaching the surface of the support member to be reflected. Optical resonance due to the first optical resonator thereby occurs more readily.

According to another aspect of the thermal detector of the present invention preferably further includes wiring connected to the heat-detecting element with at least a part of the wiring extending on the surface of the support member being covered by the first light-absorbing layer.

According to the aspect described above, with regards to wiring connected to the heat-detecting element, at least a part of the portion of the wiring extending on the surface of the support member is covered by the first light-absorbing layer. The wiring is configured from a metallic material, and metallic materials have excellent heat-conducting properties. Therefore, the portion of the wiring covered by the first light-absorbing layer (i.e., at least a part of a portion extending on the surface of the support member) plays a role of collecting heat that is generated at a position distant from the heat-detecting element and transmitting the heat to the heat-detecting element in an efficient manner. Therefore, the heat detection sensitivity of the heat-detecting element is enhanced.

According to another aspect of the thermal detector of the present invention, the heat-detecting element preferably has a pyroelectric capacitor, having a structure in which a pyroelectric material layer is disposed between a first electrode disposed closer to the support member and a second electrode disposed closer to the second light-absorbing layer, a first contact electrode connected to the first electrode, and a second contact electrode connected to the second electrode. A surface area of the second contact electrode as seen in plan view is greater than a surface area of the second electrode as seen in plan view.

According to the aspect described above, the heat-detecting element is configured from a pyroelectric capacitor. The pyroelectric capacitor has a structure in which a pyroelectric material layer is sandwiched between a first electrode nearer the support member and a second electrode nearer the second light-absorbing layer. Also, the area (in plan view) of the second contact electrode, which is connected to the second electrode, is set so as to be greater than the area of the second electrode in plan view.

The second contact electrode is configured from a metallic material. Metallic materials have excellent heat-conducting properties. Therefore, by setting the area of the second contact electrode in plan view so as to be greater than the area of the second electrode (upper electrode) of the pyroelectric capacitor in plan view, it is possible to expect an effect in which heat generated over a wide range of the second light-absorbing layer can be collected and transmitted to the heat-detecting element in an efficient manner. The heat detection sensitivity of the heat-detecting element is thereby enhanced according to the aspect described above.

According to another aspect of the thermal detector of the present invention, the second light-absorbing layer preferably contacts the second contact electrode.

According to the aspect described above, heat absorbed by the second light-absorbing layer (second optical resonator) can be transmitted to the heat-detecting element with little loss.

A thermal detection device according to another aspect of the present invention includes a plurality of the thermal detectors described in any of the aspects above disposed two-dimensionally.

As a result, a thermal detector (thermal type optical array sensor) is realized in which a plurality of the thermal detectors (thermo-optical detection elements) have been disposed two-dimensionally (e.g., disposed in an array formed along two perpendicular axes).

An electronic instrument according to another aspect of the present invention comprises the thermal detector described in any of the aspects above and a control part configured to process an output of the thermal detector.

All of the thermal detectors described above have, e.g., a wide detection wavelength band and a high detection sensitivity. The performance of the electronic instruments that contain these thermal detectors is thereby improved. Examples of electronic instruments include infrared sensor devices, thermographic devices, on-board automotive night-vision cameras, and surveillance cameras. The control part may be configured, for example, from an image processing part or a CPU.

A thermal detector manufacturing method according to another aspect of the present invention includes: forming a structure including an insulating layer on a surface of a substrate, removing at least a part of an uppermost layer of the structure and forming a concave part; forming an etching stopper film on an inner surface of the concave part, and subsequently forming a sacrificial layer in the concave part; forming a support member on the structure including the sacrificial layer; forming a heat-detecting element on the support member; forming a first light-absorbing layer on the heat-detecting element and the support member so as to be in contact with the heat-detecting element; and forming a second light-absorbing layer on the first light-absorbing layer so as to be in contact with the first light-absorbing layer, the second light-absorbing layer having a higher refractive index than that of the first light-absorbing layer. The forming of the first light-absorbing layer and the forming of the second light-absorbing layer include forming the first and second light-absorbing layers so that a thickness obtained by adding a thickness of the first light-absorbing layer and a thickness of the second light-absorbing layer is a thickness that satisfies a relationship $m \cdot (\lambda 1/4)$, where m is an integer equal to or greater than 1 and $\lambda 1$ is a first wavelength, and the thickness of the second light-absorbing layer is a thickness that satisfies a relationship $n \cdot (\lambda 2/4)$, where n is an integer equal to or greater than 1 and $\lambda 2$ is a second wavelength.

According to the aspect described above, a structure including an insulating layer is formed on the primary surface of the substrate, and the sacrificial layer is embedded in the concave part formed on a part of the structure. Then, the support member is formed. Then, a light-reflecting layer, the first light-absorbing layer, and the second light-absorbing layer, which has a higher refractive index than that of the first light-absorbing layer, are laminatingly formed on the support member. The upper surface of the first light-absorbing layer is planarized using a planarization treatment. The sacrificial layer is removed, whereby the cavity is formed. The support member is thereby supported on the structure with the cavity interposed therebetween. The surface of the support member, the interface at which the first light-absorbing layer and the second light-absorbing layer are in contact with each other, and the upper surface of the second light-absorbing layer are preferably parallel to each other.

The film thickness of each of the first light-absorbing layer and the second light-absorbing layer is adjusted so that a thickness obtained by adding the thickness of the first light-absorbing layer and the thickness of the second light-absorbing layer satisfies the relationship $m \cdot (\lambda 1/4)$ (where m is an integer equal to or greater than 1), where a first wavelength is represented by $\lambda 1$; and is adjusted so that the thickness of the second light-absorbing layer satisfies the relationship $n \cdot (\lambda 2/4)$ (where n is an integer equal to or greater than 1), where a second wavelength is represented by $\lambda 2$.

Configuring the first optical resonator, which resonates with the first wavelength $\lambda 1$, increases the effective absorption rate of light in the first light-absorbing layer and the second light-absorbing layer. Configuring the second optical resonator, which resonates with the second wavelength $\lambda 2$, increases the effective absorption rate of light in the second light-absorbing layer. Also, the resonance peaks occurring at two wavelengths overlap, making it possible to expand the detection wavelength band of the thermal detector.

Also, according to the present aspect, the two-wavelength resonators can be configured merely by adjusting the film thickness of each of the first light-absorbing layer and the second light-absorbing layer. Therefore, the thermal detector has a simple structure and can be readily manufactured. According to the present aspect, a thermal detector having a compact size and a high detection sensitivity can be readily obtained using, e.g., a semiconductor manufacturing technique (e.g., an MEMS technique).

Thus, according to at least one aspect of the present invention, the detection wavelength band of the thermal detector can be expanded using, e.g., a simple configuration.

BRIEF DESCRIPTION OF THE DRAWINGS

Referring now to the attached drawings which form a part of this original disclosure:

FIGS. 1A through 1C are drawings showing a cross-section structure of an example of a thermal detector, and examples of materials used in the first light-absorbing layer, a second light-absorbing layer, and a support member.

DETAILED DESCRIPTION OF EXEMPLARY EMBODIMENTS

Figure 2A:
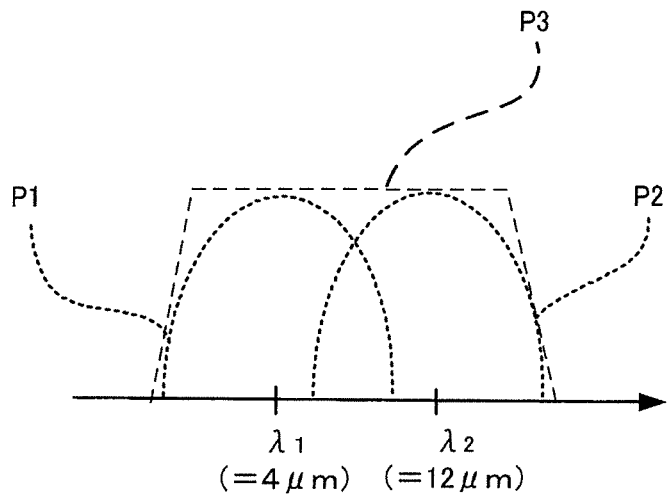
FIGS. 2A and 2B are drawings showing an example of the detection sensitivity of the thermal detector in an instance in which two optical resonators are configured, and the heat-collecting effect due to wiring portions extending on the support member.

Preferred embodiments of the present invention will now be described in detail. The matter of the present invention described in the claims is not unfairly limited by the embodiments described below, and the entireties of the configurations described in the embodiments are not necessarily essential in regard to means for solving the problems.

Embodiment 1

FIGS. 1A through 1C are drawings showing a cross-section structure of an example of a thermal detector, and examples of materials used in the first light-absorbing layer, a second light-absorbing layer, and a support member. Although FIG. 1A shows a single thermal detector, a plurality of thermal detectors can be arranged in, e.g., a matrix shape so as to configure a thermal detector array (i.e., a thermal detection device). The thermal detector shown in FIG. 1A is a pyroelectric-type infrared detector (a type of light sensor) 200 (however, this is an example, and is not provided by way of limitation).

Overall Configuration

The thermal detector 200 shown in FIG. 1A comprises a multilayer structure 150 and an element structure 160, the multilayer structure 150 having a cavity (concave part) 102 formed on an uppermost layer, and the element structure 160 being formed on the multilayer structure 150.

The element structure 160 has a support member 215, which is supported with respect to a substrate 20 with the cavity 102 interposed therebetween; a heat-detecting element 220 formed on the support member (membrane) 215; a first light-absorbing layer 270 formed on the heat-detecting element 220 and the support member 215 so as to be in contact with the heat-detecting element 220; and a second light-absorbing layer 272 formed on the first light-absorbing layer 270 so as to be in contact with the first light-absorbing layer 270, the second light-absorbing layer 272 having a higher refractive index than that of the first light-absorbing layer 270.

A first optical resonator corresponding to a first wavelength $\lambda 1$ is configured between a surface of the support member 215 and an upper surface of the second light-absorbing layer 272; and a second optical resonator corresponding to a second wavelength $\lambda 2$, which is different from the first wavelength $\lambda 1$, is configured between an interface RL, at which the first light-absorbing layer 270 and the second light-absorbing layer 272 are in contact with each other, and an upper surface of the second light-absorbing layer 272. In other words, the first wavelength $\lambda 1$ resonates between the surface of the support member 215 and the upper surface of the second light-absorbing layer 272. Also, the second wavelength $\lambda 2$, which is different from the first wavelength $\lambda 1$, resonates between the interface RL, at which the first light-absorbing layer 270 and the second light-absorbing layer 272 are in contact with each other, and an upper surface of the second light-absorbing layer 272.

The multilayer structure 150 has the substrate (a silicon substrate in this instance) 20, and a multilayer wiring structure 129 formed on a first primary surface (referred to as "surface" in this instance) of the substrate 20. The multilayer wiring structure 129 has a first insulating layer 30, a second insulating layer 40, and a third insulating layer 50. The cavity (concave part) 102 is formed on a part of the third insulating layer 50, which is the uppermost layer.

Etching stopper films (e.g., $Si_3N_4$ films) 130a, 130b are formed on inner surfaces (bottom surface and side surface) of the cavity 102. The etching stopper films 130a, 130b play a role of preventing removal of a layer not intended for etching, during a step for removing a sacrificial layer (not shown in FIG. 1A, indicated by numeral 135 in FIG. 4) in order to form the cavity 102. An etching stopper film 130c can also be provided on a surface of the multilayer wiring structure 129 (back surface of the membrane 215). The etching stopper film 130c has a function of preventing etching of the support member (membrane) 215 during, e.g., the step for removing the sacrificial layer (may be unnecessary depending on the material used to form the membrane).

A circuit element (a transistor etc.) that configures a circuit for, e.g., reading a signal is formed on a region of the substrate 20 that overlaps the heat-detecting element 220 in plan view (i.e., a region of the substrate 20 positioned below the heat-detecting element 220). The area exclusively occupied by the pyroelectric-type infrared detector 200 can thereby be reduced.

Specifically, a source layer 21 and a drain layer 22 of an MOS transistor are formed on the substrate 20.

A gate insulating film 23 is formed on the surface of the substrate 20. Side walls 25 are formed on both sides of a gate electrode 24. The gate electrode 24 has, e.g., wiring 26 connected thereto.

The multilayer wiring structure 129 includes a plug M1 made from a metal; second-layer wiring M2, a plug M3, third-layer wiring M4, and a plug M5. A plug M6 made from a metal is embedded in a contact hole provided in the support member (membrane) 215. First wiring 222, which is a constituent element of the heat-detecting element 220, is connected to the third-layer wiring M4 of the multilayer structure 150 via the plugs M6 and M5.

The heat-detecting element 220 also has a pyroelectric capacitor 230. An oriented film 238 is formed on the support member (membrane) 215, and the pyroelectric capacitor 230 is formed on the oriented film 238. The pyroelectric capacitor 230 includes a lower electrode (first electrode) 234; a pyroelectric material layer (e.g., a layer of lead zirconate titanate (PZT) functioning as a pyroelectric body) 232 formed on the lower electrode; and an upper electrode (second electrode) 236 formed on the pyroelectric material layer 232.

Each of the lower electrode (first electrode) 234 and the upper electrode (second electrode) 236 can be formed, for example, by laminating three layers of metal film. For example, a three-layer structure may be used in which iridium (Ir), iridium oxide (IrOx) and platinum (Pt) are formed by patterning, for example, in sequence from a location farthest from the pyroelectric material layer (PZT layer) 232. As described above, PZT (Pb(Zi, Ti)$O_3$; lead zirconate titanate) may be used as the pyroelectric material layer 232. This pyroelectric material layer 232 can be formed into a film, for example, by sputtering or MOCVD. The film thickness of the lower electrode (first electrode) 234 and the upper electrode (second electrode) 236 is, for example, about 0.4 µm, and the film thickness of the pyroelectric material layer 232 is, for example, about 0.1 µm.

The pyroelectric capacitor 230 is covered with an insulating film 250. A first contact hole 252 and a second contact hole 254 are provided on the insulating film 250. A part of a first contact electrode 226 is embedded in the first contact hole 252, and the first wiring 222 is connected to the first contact electrode 226. A part of a second contact electrode 228 is embedded in the second contact hole 254, and a second wiring 229 is connected to the second contact electrode 228.

A part of the first wiring 222 has an extending portion Q1 that extends on the surface of the support member (membrane) 215. Also, a part of the second wiring 229 has an extending portion Q2 that extends on the surface of the support member (membrane) 215. The first light-absorbing layer 270 and the second light-absorbing layer 272 are present on the extending portions Q1 and Q2. The expression "on" used here may refer to immediately above, or may refer to a location above (i.e., an instance in which another layer is interposed therebetween). The expression can also be broadly interpreted in a similar manner when used elsewhere.

Light incident from above the pyroelectric capacitor 230 (i.e., light incident on a region of the support member 215 in plan view) is absorbed, and converted into heat, by the first light-absorbing layer 270 and the second light-absorbing layer 272. This heat is transmitted to the pyroelectric material layer (pyroelectric body) 232, resulting in a change in the amount of electrical polarization in the pyroelectric material layer (pyroelectric body) 232 due to the pyroelectric effect. Detecting an electrical current caused by this change in the amount of electrical polarization makes it possible to detect the intensity of incident light.

Optical Resonators

As described above, in the thermal detector 200 shown in FIG. 1A, two optical resonators having different resonance wavelengths are configured. Since resonance peaks occur at two different wavelengths $\lambda 1$, $\lambda 2$, it is possible to expand the wavelength band (wavelength width) of light that can be detected by the thermal detector 200.

The first optical resonator corresponding to the first wavelength $\lambda 1$ is formed between the surface of the support member 215 and the upper surface of the second light-absorbing layer 272. Also, if the second wavelength is represented by $\lambda 2$, a second optical resonator, corresponding to the second wavelength $\lambda 2$ which is different to the first wavelength $\lambda 1$, is configured between an interface RL, at which the first light-absorbing layer 270 and the second light-absorbing layer 272 are in contact with each other (may also be referred to as a lower surface of the second light-absorbing layer 272), and the upper surface of the second light-absorbing layer 272. The first optical resonator and the second optical resonator are so-called $\lambda/4$ optical resonators.

In other words, the surface of the support member 215 and the upper surface of the second light-absorbing layer 272 are parallel; and the interface RL, at which the first light-absorbing layer 270 and the second light-absorbing layer 272 are in contact with each other, and the upper surface of the second light-absorbing layer 272, are parallel. These surfaces are used to configure optical resonators that resonate with respect to two different wavelengths. It is thereby possible to increase the efficiency of light absorption by the two light-absorbing layers using a simple configuration.

If the first wavelength is represented by $\lambda 1$, the distance between the surface of the support member 215 and the upper surface of the second light-absorbing layer 272 satisfies a relationship m·($\lambda 1/4$) (where m is an integer equal to or greater than 1). If the second wavelength is represented by $\lambda 2$, the distance between the lower surface of the second light-absorbing layer and the upper surface of the second light-absorbing layer (i.e., the film thickness of the second light-absorbing layer) satisfies a relationship n·($\lambda 2/4$) (where n is an integer equal to or greater than 1).

Specifically, if the film thickness of the first light-absorbing layer 270 is represented by H2, and the film thickness of the second light-absorbing layer 272 is represented by H3, the total film thickness H1 of the first light-absorbing layer 270 and the second light-absorbing layer 272 is adjusted to a thickness that satisfies the relationship m·($\lambda 1/4$), thereby configuring the first light-absorbing layer. If the second light-absorbing layer is represented by $\lambda 2$, the film thickness H3 of the second light-absorbing layer 272 is adjusted to a thickness that satisfies the relationship n·($\lambda 2/4$), thereby configuring the second light-absorbing layer.

According to this configuration, the surface of the support member 215, the interface RL at which the first light-absorbing layer 270 and the second light-absorbing layer 272 are in contact with each other, and the upper surface of the second light-absorbing layer 272, which are arranged parallel to each other, can be used to readily configure optical resonators that resonate with respect to two different wavelengths $\lambda 1$, $\lambda 2$. Specifically, the efficiency of light absorption in the two light-absorbing layers 270, 272 can be increased using a simple configuration. Since only the film thickness of each of the first light-absorbing layer 270 and the second light-absorbing layer 272 needs to be adjusted, the structure of the thermal detector 200 is not complex, and the thermal detector 200 can be readily manufactured.

Some of the incident light that is incident on the region of the support member 215 in plan view is absorbed by at least one of the first light-absorbing layer 270 and the second light-absorbing layer 272; some of the light is reflected by the interface RL (reflection interface) between the first light-absorbing layer 270 and the second light-absorbing layer 272; some of the light that is not absorbed by the second light-absorbing layer 272 reaches the surface of the support member 215; and some of the light that reaches the surface of the support member 215 is reflected. Some of the light that is reflected by the surface of the support member 215 is absorbed by at least one of the first light-absorbing layer 270 and the second light-absorbing layer 272. Light that is not absorbed is reflected by the upper surface of the second light-absorbing layer 272 and caused to travel back downwards. The operation above is repeated, resulting in resonance of the first wavelength $\lambda 1$.

The incident light, which has a wavelength of $\lambda 1$, and the light reflected by the surface of the support member 215, which has a wavelength of $\lambda 1$, mutually interfere and cancel each other out, and the effective absorption rate in the first light-absorbing layer 270 and the second light-absorbing layer 272 increases. In other words, configuring the first light-absorbing layer makes it possible to increase the effective absorption rate in each of the light-absorbing layers 270, 272.

Also, some of the incident light that is incident on the region of the support member 215 in plan view is reflected at the interface between the first light-absorbing layer 270 and the second light-absorbing layer 272. Since the refractive index of the second light-absorbing layer 272 is higher than the refractive index of the first light-absorbing layer 270, light is reliably reflected at the interface RL between the first light-absorbing layer 270 and the second light-absorbing layer 272. Light that is reflected at the interface (reflection interface) RL is absorbed by the second light-absorbing layer 272. Light that is not absorbed is reflected by the upper surface of the second light-absorbing layer 272 and caused to travel back downwards. The operation above is repeated, resulting in resonance of the second wavelength $\lambda 2$.

The incident light, which has a wavelength of $\lambda 2$, and the light reflected by the interface RL between the first light-absorbing layer 270 and the second light-absorbing layer 272 (i.e., the lower surface of the second light-absorbing layer 272), which has a wavelength of $\lambda 2$, thereby mutually interfere and cancel each other out, making it possible to increase the effective absorption rate in the second light-absorbing layer 272.

Thus, resonance peaks occur at two different wavelengths, making it possible to expand the wavelength band (wavelength width) of light that can be detected by the thermal detector 200. Therefore, the detection wavelength band of the thermal detector can be expanded using a simple configuration.

Specifically, the first wavelength $\lambda 1$ can be set to 4 $\mu$m, and the second wavelength $\lambda 2$ can be set to 12 $\mu$m. In such an instance, the film thickness of the first light-absorbing layer 270 can be set to, e.g., 3 $\mu$m, and the film thickness of the second light-absorbing layer 272 can be set to, e.g., 1 $\mu$m.

Examples of Materials Used in First Light-Absorbing Layer, Second Light-Absorbing Layer, and Support Member Examples of materials used in the first light-absorbing layer 270, the second light-absorbing layer 272, and the support member 215 are shown in FIGS. 1B and 1C. In the example shown in FIG. 1B, the support member 215 is configured from three layers of laminated film, comprising a lower-layer silicon nitride (SiN) film 211a, a silicon oxide (SiO) film 211b, and an upper-layer silicon nitride (SiN) film 211c. The first light-absorbing layer 270 and the second light-absorbing layer 272 are both configured from a silicon oxide film. However, film-forming conditions under which each of the light-absorbing layers is formed are made to differ so that the refractive index of the first light-absorbing layer 270 is higher than the refractive index of the second light-absorbing layer 272. The second light-absorbing layer 272 is a low-refractive-index layer, and the first light-absorbing layer 270 is a first high-refractive-index layer.

The surface of the support member 215 is a surface of the SiN layer (second high-refractive-index layer) 211c, which is a material layer that has a higher refractive index than that of the first light-absorbing layer 270.

For example, the refractive index of the second light-absorbing layer (low-refractive-index layer) 272 can be set to 1.3, the refractive index of the first light-absorbing layer (first high-refractive-index layer) 270 can be set to 1.2, and the refractive index of the SiN layer (second high-refractive-index layer) 211 can be set to 2.0.

Since the surface of the support member 215 is the surface of the SiN layer (second high-refractive-index layer) 211c, which is a material layer with the highest refractive index, light can be reliably reflected at the surface of the support member 215. Optical resonance in the first optical resonator (i.e., resonance at wavelength $\lambda 1$) thereby occurs more readily.

Also, since the first light-absorbing layer 270 (first high-refractive-index layer), which has a higher refractive index, is present below the second light-absorbing layer 272 (low-refractive-index layer), which has a lower refractive index, light is reflected at the interface RL between the first light-absorbing layer 270 and the second light-absorbing layer 272. Optical resonance in the second optical resonator (i.e., resonance at wavelength $\lambda 2$) thereby occurs more readily.

The example shown in FIG. 1B is only one example, and is not provided by way of limitation. Broadly speaking, a material layer that has light-reflecting characteristics such that light is reflected can be regarded as a constituent element of the support member, wherein the surface of the material layer can be used as a reflecting surface. The corresponding material layer may form the entire support member 215. Alternatively, the corresponding material layer may form an uppermost layer (i.e., a layer nearest the first light-absorbing layer 270), from among the plurality of laminated material layers forming the support member 215 (as in the example shown in FIG. 1A).

In the example shown in FIG. 1C, the surface of the support member 215 is a surface of a material layer 213d having light-reflecting characteristics such that light is reflected. Titanium (Ti) or another metallic material that totally reflects light can be used as the material layer 213d having light-reflecting characteristics. Titanium oxide ($TiO_2$) or another material having a high refractive index can also be used.

In the example shown in FIG. 1C, the first light-absorbing layer 270 is configured from a silicon nitride (SiN) film (high-refractive-index layer), and the second light-absorbing layer 272 is configured from a silicon oxide (SiO) film (low-refractive-index layer). For example, the refractive index of the second light-absorbing layer (low-refractive-index layer) 272 can be set to 1.4, the refractive index of the first light-absorbing layer (high-refractive-index layer) 270 can be set to 2.0, and a metallic material that totally reflects light (e.g., Ti) can be used as the material layer 213d providing the surface of the support member 215.

In the example shown in FIG. 1C, a material layer having light-reflecting characteristics such that light is reflected is regarded as a constituent element of the support member 215, wherein the surface of the material layer is used as a reflecting surface. The corresponding material layer may form the entire support member 215. Alternatively, the corresponding material layer may form an uppermost layer (i.e., a layer nearest the first light-absorbing layer), from among the plurality of laminated material layers forming the support member 215 (as in the example shown in FIG. 1C).

In the example shown in FIG. 1C, the majority of light reaching the surface of the support member 215 can be reliably reflected. Optical resonance by the first optical resonator thereby occurs more readily.

Figure 2B:
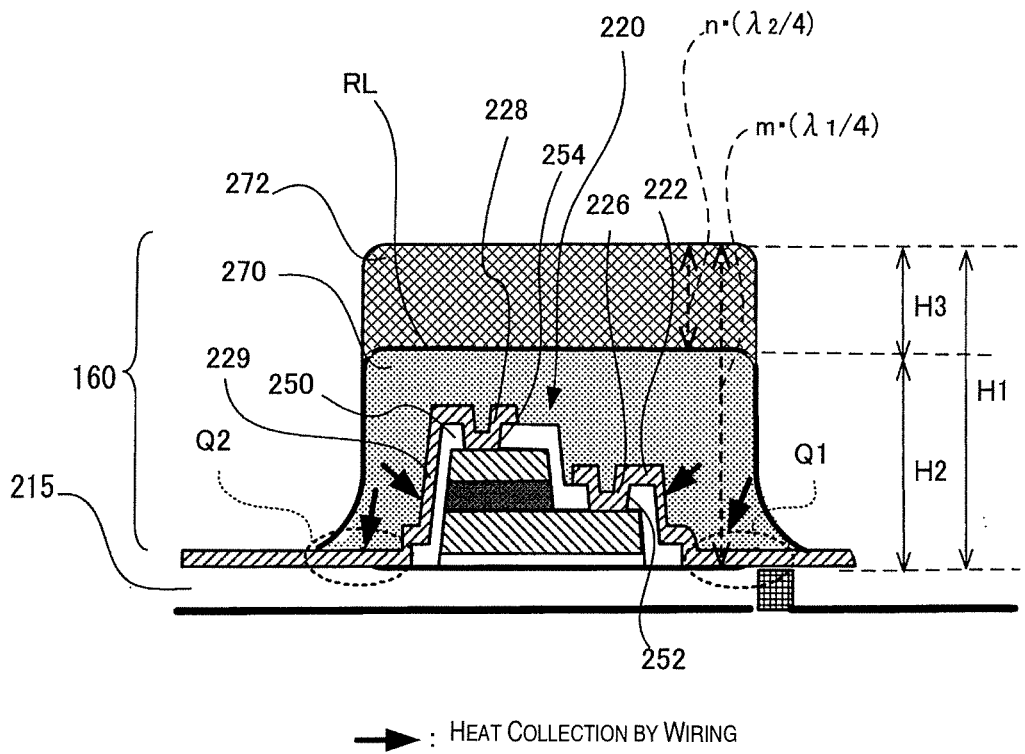

Example of Light-Absorbing Characteristics, and Heat-Collecting Effect Due to Wiring Portions Extending on Support Member FIGS. 2A and 2B are drawings showing an example of the detection sensitivity of the thermal detector in an instance in which two optical resonators are configured, and the heat-collecting effect due to wiring portions extending on the support member.

FIG. 2A shows an example of the detection sensitivity of the thermal detector in an instance in which two optical resonators are configured. As shown in FIG. 2A, it is possible to expand the wavelength band corresponding to the detection sensitivity of the thermal detector. In the example shown in FIG. 2A, a resonance peak P1 due to the first optical resonator appears at wavelength $\lambda 1$ (e.g., $\lambda 1=4$ μm), and a resonance peak P2 due to the second optical resonator appears at wavelength $\lambda 2$ (e.g., $\lambda 2=12$ μm). These peak characteristics are combined, thereby expanding the detection sensitivity P3 of the thermal detector 200. In other words, there is obtained a thermal detector 200 having a detection sensitivity that extends over a wide wavelength region.

FIG. 2B shows the heat-collecting effect due to wiring portions Q1, Q2 extending on the support member (membrane) 215. FIG. 2B shows main parts of the thermal detector 200 shown in FIG. 1A.

As shown in FIG. 2B, with regards to each of the wiring (the first wiring 222 and the second wiring 229) connected to the heat-detecting element 220, at least a part of a portion (Q1, Q2) of each of the wiring extending on the surface of the support member (membrane) 215 is covered by the first light-absorbing layer 270.

The first wiring 222 and the second wiring 229 are configured from, e.g., aluminum or another metal. Metals generally have superb heat-conducting properties. Therefore, the portion of the wiring covered by the first light-absorbing layer 270 (i.e., at least a part Q1, Q2 of a portion extending on the surface of the support member) plays a role of collecting heat that is generated at a position distant from the heat-detecting element 220 and transmitting the heat to the heat-detecting element 220 in an efficient manner. Therefore, the heat detection sensitivity of the heat-detecting element 220 is enhanced.

In FIG. 2B, heat that is collected by the first wiring 222 and the second wiring 229 is represented by bold arrows. As can be seen from FIG. 2B, a portion of each of the first wiring 222 and the second wiring 229 that passes on a side surface of the heat-detecting element 220 (the pyroelectric capacitor 230) is also covered by the first light-absorbing layer 270, and therefore the heat-collecting effect can also be expected to be in evidence at this portion.

Thermal Detector Manufacturing Method

A description will now be given for an example of a thermal detector manufacturing method, with reference to FIGS. 3 through 5.

Figure 3A:
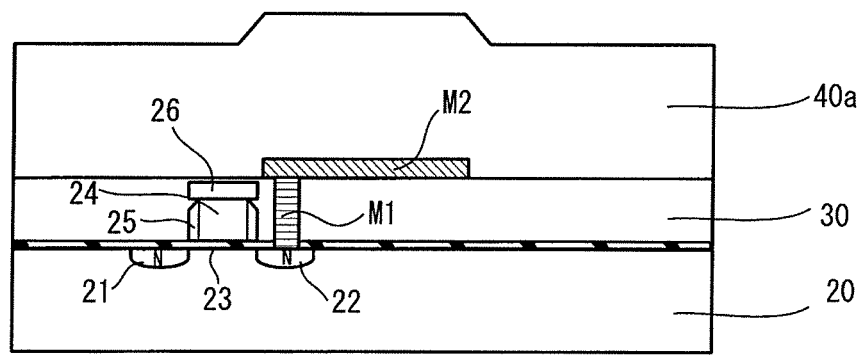
FIGS. 3A and 3B are cross-section views of a device showing an example of a thermal detector manufacturing method.
Figure 3B:
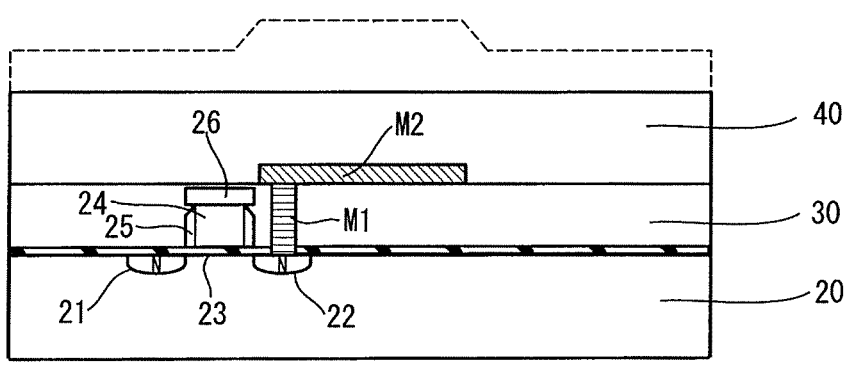

FIGS. 3A and 3B are cross-section views of a device showing an example of a thermal detector manufacturing method. In the step shown in FIG. 3A, the first insulating layer 30 and the second insulating layer 40a, which are constituent elements of the multilayer wiring structure 129, are laminatingly formed on a first primary surface of a substrate 20.

A source layer 21 and a drain layer 22 of an MOS transistor are formed on the substrate 20. A gate insulating film 23 is formed on a surface of the substrate 20. Side walls 25 are formed on both sides of a gate electrode 24. The gate electrode 24 has, e.g., wiring 26 connected thereto. A plug M1, made from tungsten (W) or another metal, is formed on a part of the first insulating layer 30. Second-layer wiring M2, made from Al or a similar material, is formed on the first insulating layer 30.

In the step shown in FIG. 3B, the second insulating layer 40a is planarized by a planarization treatment using, e.g., chemical-mechanical polishing (CMP). A planarized second insulating layer 40 is thereby formed.

Figure 4A:
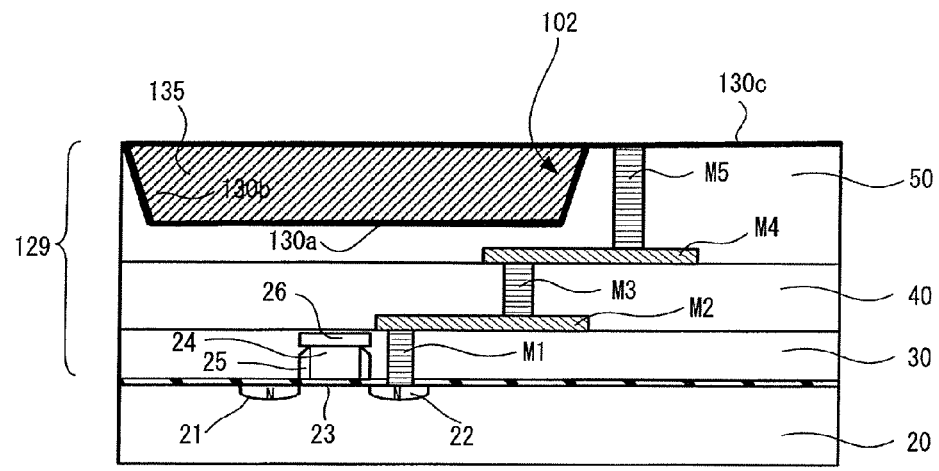
FIGS. 4A and 4B are cross-section views of a device showing an example of a thermal detector manufacturing method.
Figure 4B:
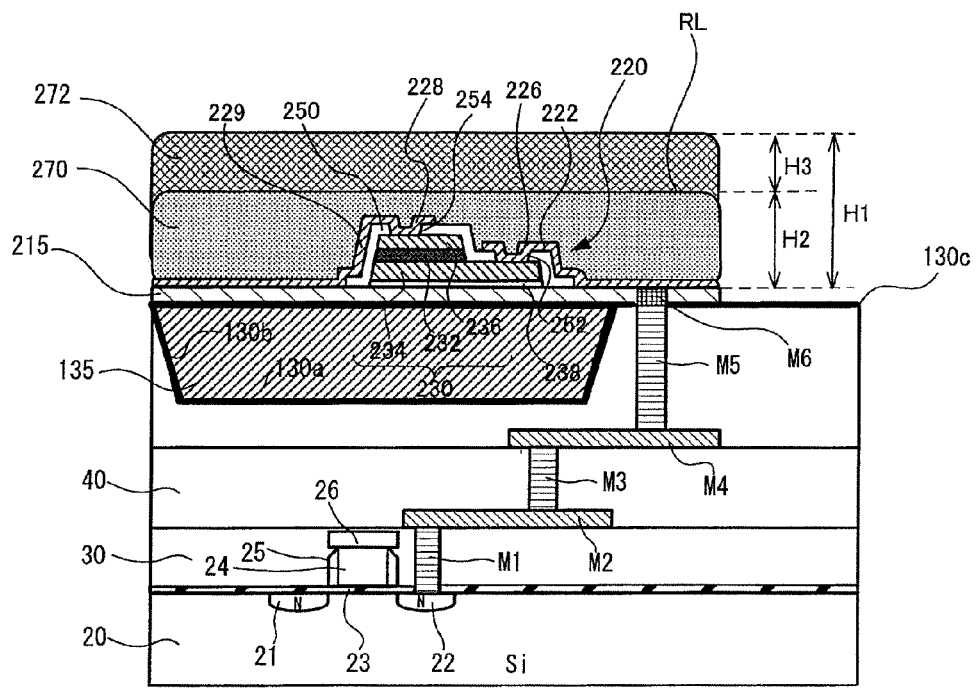

FIGS. 4A and 4B are cross-section views of a device showing an example of a thermal detector manufacturing method. The step shown in FIG. 4A is one that follows the step shown in FIG. 3B.

In the step shown in FIG. 4A, a third insulating layer 50 is formed on the second insulating layer 40, the concave part 102 is formed on a part of the surface of the third insulating layer 50, and etching stopper films (SiN) 130 (130a through 130c) are formed on inner surfaces of the cavity 102. Then, a sacrificial layer (e.g., an SiO layer) 135 is embedded in the cavity 102.

Next, as shown in FIG. 4B, a support member (membrane) 215 and a heat-detecting element 220 (including a pyroelectric capacitor 230, a first contact electrode 226, an insulating layer 250, a second contact electrode 228, first wiring 222, and second wiring 229). Then, an SiO layer 270, which functions as the first light-absorbing layer, is formed. Then, an SiO layer 272, which functions as the second light-absorbing layer, is formed on the SiO layer 270. The SiO layer 272 can also be formed after the surface of the SiO layer 270 is planarized. Such an instance results in the interface (reflection interface) RL between the SiO layer 270 and the SiO layer 272 being flatter.

When the SiO layer 270 and the SiO layer 272 are formed, the film-forming conditions are made to differ so that the refractive index of the SiO layer 272 is higher than the refractive index of the SiO layer 270. The above is provided merely by way of example; alternatively, the material may be made to differ to generate the difference in the refractive indices.

The thickness (height) of the SiO layer 270 is represented by H2, and the thickness (height) of the SiO layer 272 is represented by H3. The thickness obtained by adding the thickness of the SiO layer 270 and the thickness of the SiO layer 272 is represented by H1. As described above, the relationship $H1=m \cdot (\lambda 1/4)$ is true, and the relationship $H3=n \cdot (\lambda 2/4)$ is also true.

In the step shown in FIG. 3B described further above, the second insulating layer 40 is planarized by CMP or a similar process. Therefore, the surface of each of the layers laminated and formed on the second insulating layer 40 is also flat. Therefore, the surface of the support member 215, the interface RL between the SiO layer 270 and the SiO layer 272, and the upper surface of the SiO layer 272 are parallel to each other.

Figure 5:
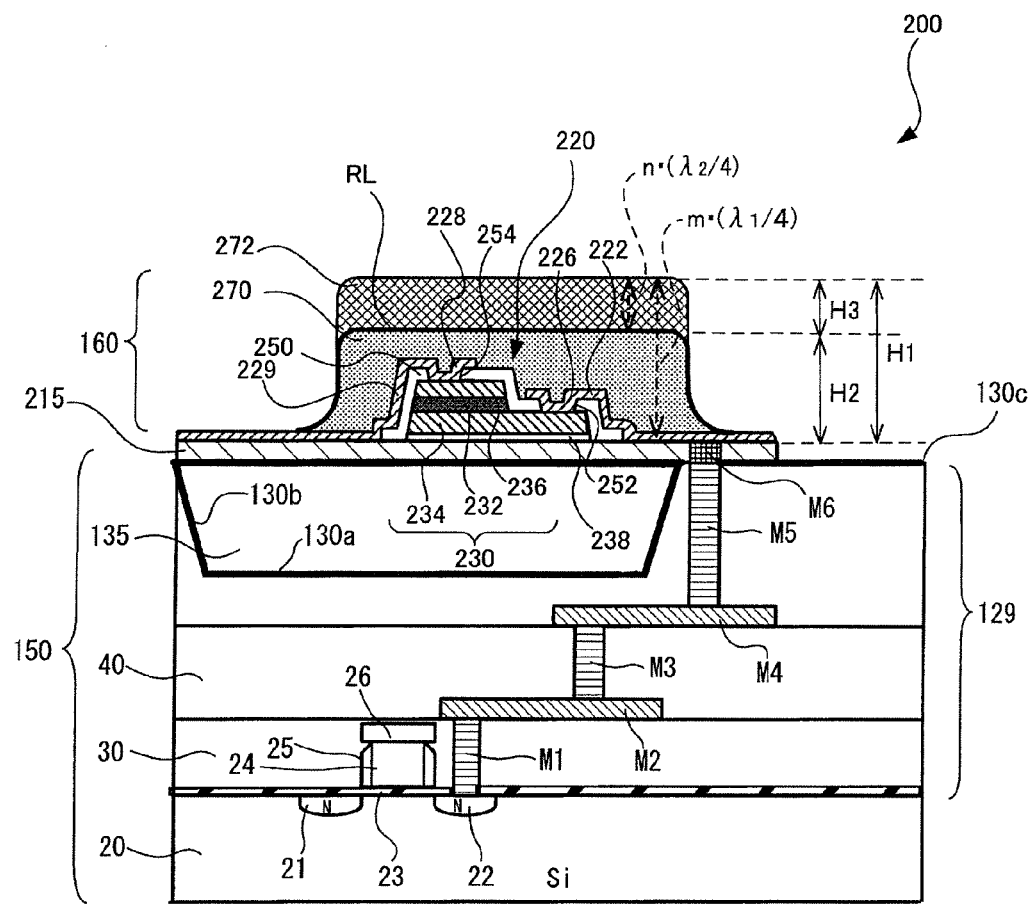
FIG. 5 is a cross-section view of the device showing an example of a method for manufacturing the thermal detector.

FIG. 5 is a cross-section view of the device showing an example of a method for manufacturing the thermal detector. The step shown in FIG. 5 is one that follows the step shown in FIG. 4B. In the step shown in FIG. 5, the SiO layer 270 and the SiO layer 272 are patterned. The first light-absorbing layer 270 and the second light-absorbing layer 272 are thereby formed.

Next, the sacrificial layer 135 is removed and the cavity (thermal isolation cavity) 102 is formed. Thus, the thermal detector 200 having resonators that resonate with respect to two wavelengths is completed. As described further above, the first optical resonator corresponding to the first wavelength λ1 is formed between the surface of the support member 215 and the upper surface of the second light-absorbing layer 272. The second optical resonator corresponding to the second wavelength λ2, which is different from the first wavelength λ1, is formed between the interface RL, at which the first light-absorbing layer 270 and the second light-absorbing layer 272 are in contact with each other (may also be referred to as the lower surface of the second light-absorbing layer 272), and the upper surface of the second light-absorbing layer 272. The first optical resonator and the second optical resonator are so-called λ/4 resonators. The λ/4 resonator can be configured merely by adjusting the film thickness of the first light-absorbing layer 270 and the second light-absorbing layer 272. Therefore, the structure of the thermal detector 200 is not complex, and the thermal detector 200 can be readily manufactured.

Thus, a structure (multilayer wiring structure) 130 including insulating layers is formed on a primary surface of the substrate 20; a part of at least the third insulating layer 50, which is the uppermost layer of the structure 130, is removed and a concave part 102 is formed; etching stopper films 130a through 130c are formed on inner surfaces of the concave part 102; then, the sacrificial layer 135 is formed in the concave part 102. Next, the support member (membrane) 215 is formed on the structure 130 including the sacrificial layer 135, and the heat-detecting element 220 is formed on the support member (membrane) 215. Next, the first light-absorbing layer 270 is formed on the heat-detecting element 220 and the support member (membrane) 215 so as to be in contact with the heat-detecting element 220; and the second light-absorbing layer 272, which has a higher refractive index than that of the first light-absorbing layer 270, is formed on the first light-absorbing layer 270 so as to be in contact with the first light-absorbing layer 270. The thermal detector 200 can thereby be formed.

The thickness H1, obtained by adding the thickness H2 of the first light-absorbing layer 270 and the thickness H3 of the second light-absorbing layer 272, is set to a thickness that satisfies the relationship m·(λ1/4); and the thickness H3 of the second light-absorbing layer 272 is set to a thickness that satisfies the relationship n·(λ2/4), whereby it is possible to readily configure the two optical resonators.

Configuring the first optical resonator, which resonates with respect to the first wavelength λ1, increases the effective light absorption rate in the first light-absorbing layer and the second light-absorbing layer. Configuring the second optical resonator, which resonates with respect to the second wavelength λ2, increases the effective light absorption rate in the second light-absorbing layer. Also, the resonance peaks occurring at two wavelengths overlap, making it possible to expand the detection wavelength band of the thermal detector.

Also, the two-wavelength resonators can be configured merely by adjusting the film thickness of each of the first light-absorbing layer 270 and the second light-absorbing layer 272. Therefore, the thermal detector has a simple structure and can be readily manufactured. Thus, a thermal detector 200 having a compact size and a high detection sensitivity can be readily obtained using, e.g., a semiconductor manufacturing technique (e.g., an MEMS technique).

Embodiment 2

Figure 6:
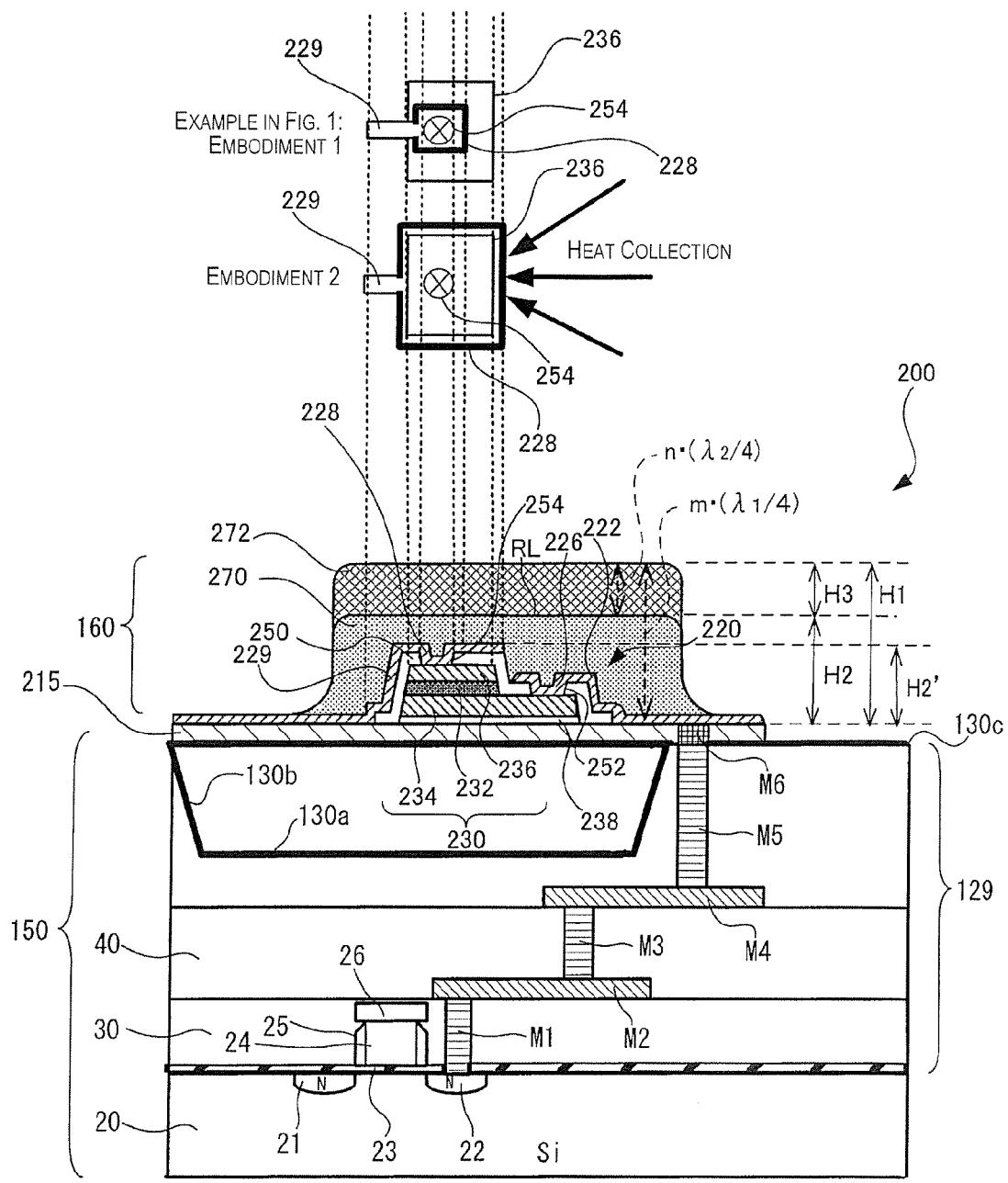
FIG. 6 is a drawing showing the configuration of another example of the thermal detector.

FIG. 6 is a drawing showing the configuration of another example of the thermal detector according to the present invention. The basic structure of the thermal detector shown in FIG. 6 is the same as the structure of the thermal detector shown in FIG. 1. However, in the example shown in FIG. 6, the area (size) of the second contact electrode 228 in plan view is set so as to be greater than the area (size) of the second electrode (upper electrode) 236 forming the pyroelectric capacitor 230, and the example shown in FIG. 6 is different from the example shown in FIG. 1 in this respect.

The upper side of FIG. 6 shows the shape, in plan view, of the second contact electrode 228 according to the example shown in FIG. 1 (i.e., the Embodiment 1) and the shape, in plan view, of the second contact electrode 228 in the present embodiment (i.e., the Embodiment 2).

As described previously, the heat-detecting element 220 has a pyroelectric capacitor 230, which has a structure in which the pyroelectric material layer 232 is sandwiched between the first electrode 234 on the side nearer the support member 215 and the second electrode 236 on a side nearer the second light-absorbing layer 272; a first contact electrode 226 that is connected to the first electrode 234; and a second contact electrode 228 that is connected to the second electrode 236.

In the example shown in FIG. 1 (i.e., the Embodiment 1), the area of the second contact electrode 228 in plan view is smaller than the area of the second electrode (upper electrode) 236. In contrast, in the present embodiment (i.e., the Embodiment 2), the area of the second contact electrode 228 in plan view is set so as to be deliberately greater than the area of the second electrode (upper electrode) 236 in plan view.

The second contact electrode 228 is configured from Al or another metallic material. Metallic materials generally have excellent heat-conducting properties. Therefore, by setting the area of the second contact electrode 228 in plan view so as to be greater than the area of the second electrode (upper electrode) 236 of the pyroelectric capacitor in plan view, it is possible to expect an effect in which heat generated over a wide range of the second light-absorbing layer 272 can be collected and transmitted to the heat-detecting element 220 in an efficient manner.

In FIG. 6, heat collected by the second contact electrode 228 is shown by bold arrows. Therefore, in the present embodiment, the heat detection sensitivity of the heat-detecting element 220 is enhanced.

In the thermal detector shown in FIG. 6, the second light-absorbing layer 272 is formed so as to be in contact with the second contact electrode 228. Therefore, heat absorbed by the second light-absorbing layer (second optical resonator) 272 can be transmitted to the heat-detecting element with little loss. Also, the height H2 of the first light-absorbing layer 270 is preferably aligned with the height position of the second contact electrode 228 (i.e., the height H2 of the first light-absorbing layer is preferably equal to height H2' shown in the drawing). In such an instance, heat absorbed by the second optical resonator (second light-absorbing layer) can be transmitted to the heat-detecting element 220 in an efficient manner with little loss.

Thermal Detection Device

Figure 7:
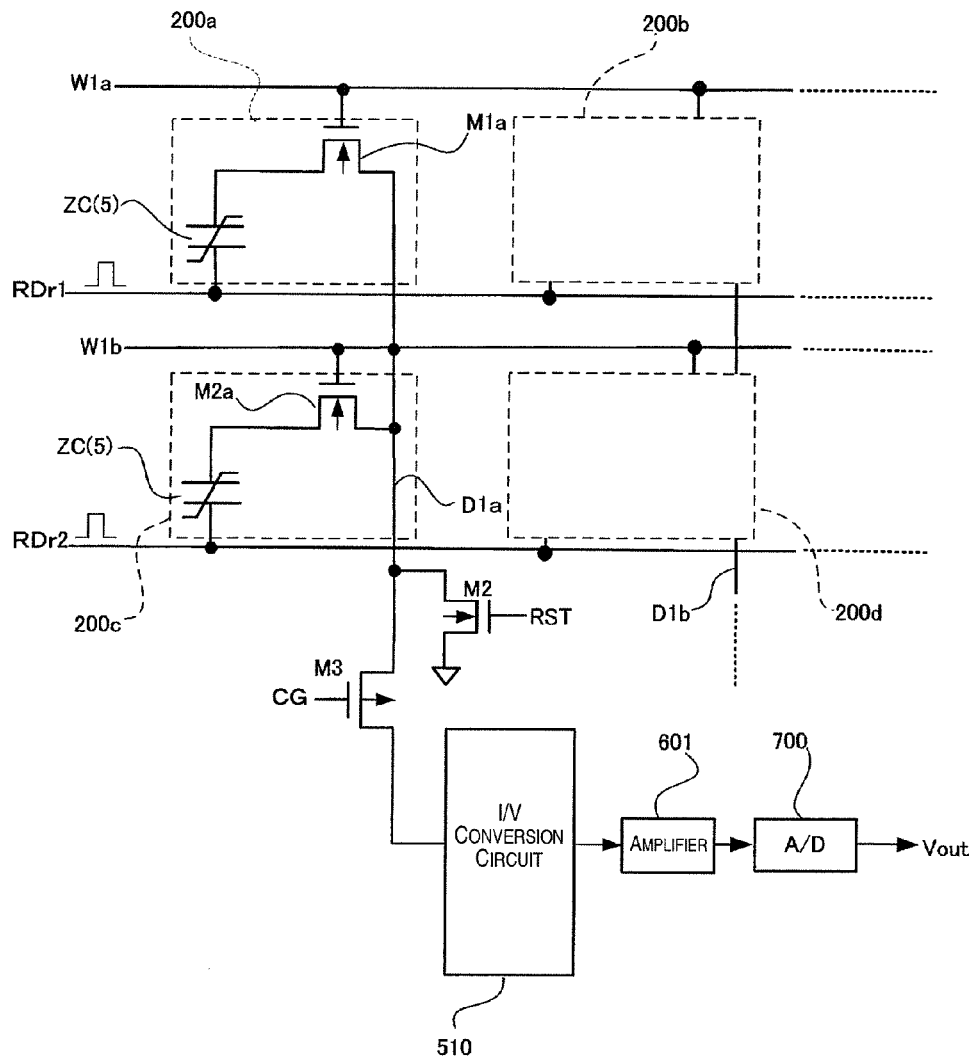
FIG. 7 is a circuit diagram showing an example of the circuit configuration of a thermal detection device (thermal detector array).

FIG. 7 is a circuit diagram that shows an example of a circuit configuration for the thermal detector (thermal type photodetecting array) including the thermal detector according to any of the illustrated embodiments. In the example of FIG. 7, a plurality of photodetecting cells (specifically, thermal detectors 200a to 200d) are disposed two-dimensionally. In order to select single photodetecting cells from among the plurality of photodetecting cells (thermal detectors 200a to 200d), scan lines (W1a, W1b, etc.) and data lines (D1a, D1b, etc.) are provided.

The thermal detector 200a that serve as a single photodetecting cell has an element-selection transistor M1a and a piezoelectric capacitor ZC that serves as the thermal type photodetecting element 5. The potential relationship of the two poles of the piezoelectric capacitor ZC can be inverted by switching the potential that is applied to PDr1 (by inverting this potential, it is not necessary to provide a mechanical chopper). Other photodetecting cells are similarly configured.

The potential of the data line D1a can be initialized by turning on a reset transistor M2. When reading a detection signal, the read transistor M3 is ON. The current that is generated as a result of the pyroelectric effect is converted to voltage by an I/V conversion circuit 510, amplified by an amplifier 601, and converted to digital data by an A/D converter 700.

In this embodiment, a plurality of thermal detectors is disposed two-dimensionally (for example, disposed in the form of an array along two respective perpendicular axes (X-axis and Y-axis)), thereby realizing a thermal detection device (thermal-type optical array sensor).

Electronic Instrument

Figure 8:
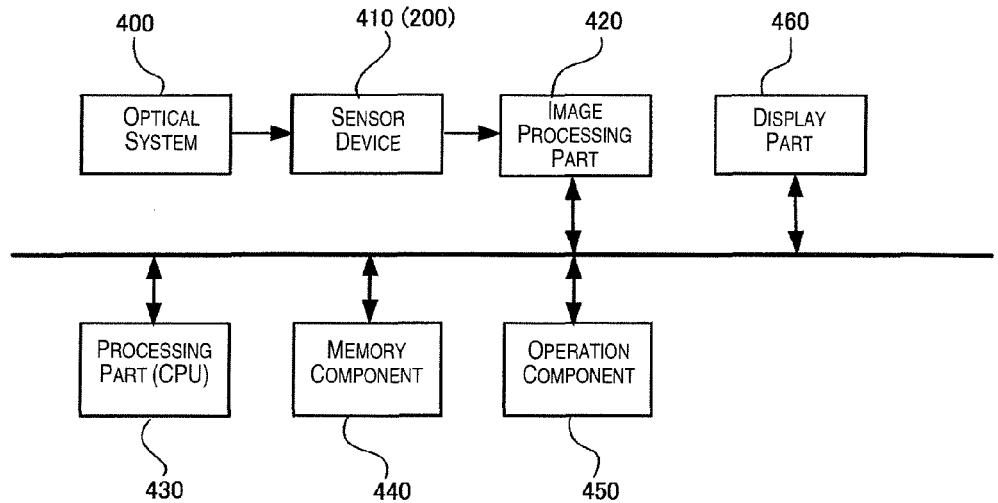
FIG. 8 is a drawing showing an example of the configuration of an electronic instrument.

FIG. 8 is a diagram showing an example of the configuration of an electronic instrument. Examples of the electronic instrument include an infrared sensor device, a thermographic device, and an on-board automotive night-vision camera or surveillance camera.

As shown in FIG. 8, the electronic instrument comprises an optical system 400, a sensor device 410 (corresponding to the thermal detector 200 in the previous embodiment), an image processing part 420, a processing part 430, a memory component 440, an operation component 450, and a display part 460. The electronic instrument of this embodiment is not restricted to the configuration of FIG. 8, and various modified embodiment are possible in which some of the constituent elements (e.g., the optical system, operational, part, or display part) are omitted and other constituent elements are added.

The optical system 400 includes one or a plurality of lenses and driving parts for driving these lenses. Imaging and the like of the subject is carried out on the sensor device 410. In addition, focus adjustment may be carried out as necessary.

The sensor device 410 has a configuration in which the photodetectors of the embodiments described above are laid out two-dimensionally, and a plurality of lines (scan lines (or word lines)) and a plurality of columns (data lines) are provided. The sensor device 410 can also comprise line selection circuits (line drivers), a read circuit for reading data from the photodetectors via the columns, an A/D converter, and the like, in addition to the photodetectors that are laid out two-dimensionally. Because data is sequentially read from photodetectors that are laid out two-dimensionally, a captured image of the subject can be processed.

Based on the digital image data (pixel data) from the sensor device 410, the image processing part 420 carries out various image processing operations such as image correction processing. The image processing part 420 corresponds to the control part that processes the output of the sensor device 410 (thermal detector 200). The processing part 430 carries out control of the respective elements of the electronic instrument and overall control of the electronic instrument. This processing part 430 is realized, for example, in a CPU or the like. The memory component 440 stores various types of information, and, for example, functions as a work space for the processing part 430 or the image processing part 420. The operation component 450 is used as an interface for a user to operate the electronic instrument and can be worked, for example, in the form of various buttons, a GUI (graphical user interface) screen, or the like.

The display part 460 displays the GUI screen, images that have been captured by the sensor device 410, and the like, and is worked in the form of various types of displays, such as a liquid crystal display or organic EL display.

By using the thermal detector of a single cell as a sensor such as an infrared light sensor in this manner and by disposing the thermal detector of each cell along two perpendicular axes, a sensor device (thermal type photodetecting device) 410 can be configured. When this is done, a thermal (light) distribution image can be captured. By using this sensor device 410, it is possible to configure an electronic instrument such as a thermographic device, or an on-board automotive night-vision camera or surveillance camera.

As described previously, the thermal detector according to the present invention has high light detection sensitivity. Thus, the performance of the electronic instrument in which the thermal detector is mounted is increased.

Figure 9:
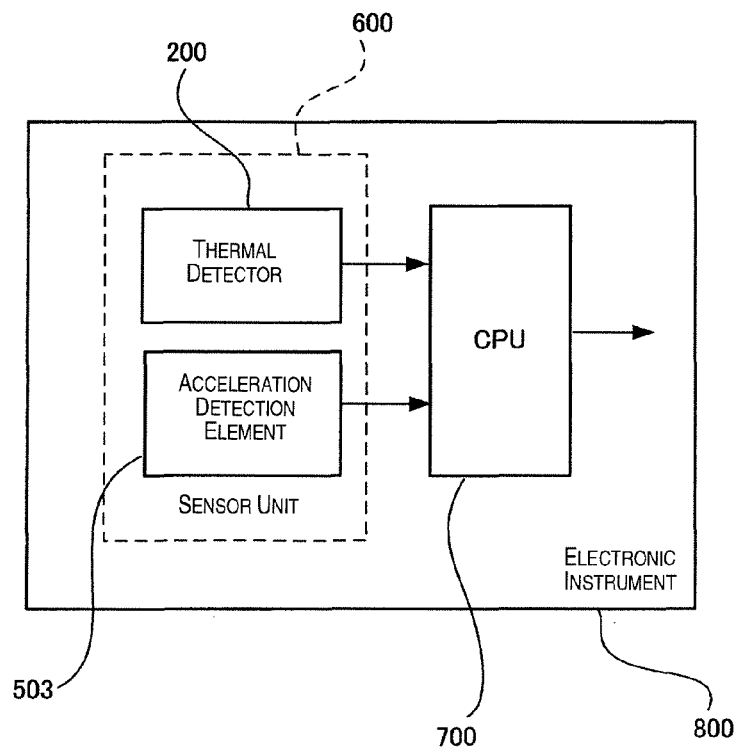
FIG. 9 is a drawing showing another example of the configuration of an electronic instrument.

FIG. 9 is a diagram showing another example of the configuration of the electronic instrument. The electronic instrument 800 of FIG. 9 comprises a thermal detector 200 and an acceleration detection element 503 which are mounted in a sensor unit 600. The sensor unit 600 also can carry a gyro sensor or the like. Various types of physical quantities can be measured by the sensor unit 600. The various detection signals that are output from the sensor unit 600 are processed by a CPU 700. The CPU 700 corresponds to the control part for processing the output of the thermal detector 200.

As described above, in accordance with at least one embodiment of the present invention, for example, the detection sensitivity of a thermal detector can be dramatically improved.

In addition, in the embodiments described above, although a pyroelectric capacitor is used as the heat-detecting element, a thermopile element or bolometer element may be used instead.

In addition, in the embodiments described above, an infrared detector that detects infrared light is used as an example of a thermal detector. However, it will be apparent from this disclosure that the thermal detector according to the present invention may be configured and arranged to detect other type of light such as terahertz light, for example.

GENERAL INTERPRETATION OF TERMS

In understanding the scope of the present invention, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives. Also, the terms "part," "section," "portion," "member" or "element" when used in the singular can have the dual meaning of a single part or a plurality of parts. Also as used herein to describe the above embodiments, the following directional terms "top", "bottom", "upper", "lower", "forward", "rearward", "above", "downward", "vertical", "horizontal", "below" and "transverse" as well as any other similar directional terms refer to those directions of the thermal detector when the thermal detector is oriented as shown in FIG. 1A. Finally, terms of degree such as "substantially", "about" and "approximately" as used herein mean a reasonable amount of deviation of the modified term such that the end result is not significantly changed. For example, these terms can be construed as including a deviation of at least ±5% of the modified term if this deviation would not negate the meaning of the word it modifies.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents. All modifications such as described above may be understood to fall within the scope of the invention. Terms disclosed together with different equivalent or broader terms in at least one instance in the specification or drawings, for example, may be replaced by these different terms at any place in the specification or drawings.

What is claimed is:

1. A thermal detector comprising:
   a substrate;
   a support member supported on the substrate so that a cavity is formed between the substrate and the support member;
   a heat-detecting element formed on the support member;
   a first light-absorbing layer contacting the heat-detecting element and formed on the heat-detecting element and the support member; and
   a second light-absorbing layer contacting the first light-absorbing layer and formed on the first light-absorbing layer, the second light-absorbing layer having a higher refractive index than that of the first light-absorbing layer,
   the support member, the first light-absorbing layer and the second light-absorbing layer being arranged such that
      a first wavelength resonates between a surface of the support member and an upper surface of the second light-absorbing layer, and
      a second wavelength, which is different from the first wavelength, resonates between an interface, at which the first light-absorbing layer and the second light-absorbing layer are in contact with each other, and the upper surface of the second light-absorbing layer.

2. The thermal detector according to claim 1, wherein
   the surface of the support member and the upper surface of the second light-absorbing layer are parallel to each other,
   the interface at which the first light-absorbing layer and the second light-absorbing layer are in contact with each other and the upper surface of the second light-absorbing layer are parallel to each other,
   a distance between the surface of the support member and the upper surface of the second light-absorbing layer satisfies a relationship $m \cdot (\lambda 1/4)$, where m is an integer equal to or greater than 1 and $\lambda 1$ is the first wavelength, and
   a distance between the interface at which the first light-absorbing layer and the second light-absorbing layer are in contact with each other and the upper surface of the second light-absorbing layer satisfies a relationship $n \cdot (\lambda 2/4)$, where n is an integer equal to or greater than 1 and $\lambda 2$ is the second wavelength.

3. A thermal detection device comprising a plurality of the thermal detectors according to claim 2 arranged two-dimensionally.

4. An electronic instrument comprising:
   the thermal detector according to claim 2; and
   a control part configured to process an output of the thermal detector.

5. The thermal detector according to claim 1, wherein
   the surface of the support member is a surface of a layer of a material having a higher refractive index than that of the first light-absorbing layer.

6. A thermal detection device comprising a plurality of the thermal detectors according to claim 5 arranged two-dimensionally.

7. An electronic instrument comprising:
   the thermal detector according to claim 5; and
   a control part configured to process an output of the thermal detector.

8. The thermal detector according to claim 1, wherein
   the surface of the support member is a surface of a layer of a material having light-reflecting characteristics such that light is reflected.

9. A thermal detection device comprising a plurality of the thermal detectors according to claim 8 arranged two-dimensionally.

10. An electronic instrument comprising:
    the thermal detector according to claim 8; and
    a control part configured to process an output of the thermal detector.

11. The thermal detector according to claim 1, further comprising
    wiring connected to the heat-detecting element with at least a part of the wiring extending on the surface of the support member being covered by the first light-absorbing layer.

12. An electronic instrument comprising:
    the thermal detector according to claim 11; and
    a control part configured to process an output of the thermal detector.

13. The thermal detector according to claim 1, wherein
    the heat-detecting element has
       a pyroelectric capacitor, having a structure in which a pyroelectric material layer is disposed between a first electrode disposed closer to the support member and a second electrode disposed closer to the second light-absorbing layer,
       a first contact electrode connected to the first electrode, and
       a second contact electrode connected to the second electrode,
       a surface area of the second contact electrode as seen in plan view being greater than a surface area of the second electrode as seen in plan view.

14. The thermal detector according to claim 13, wherein
    the second light-absorbing layer contacts the second contact electrode.

15. An electronic instrument comprising:
    the thermal detector according to claim 13; and
    a control part configured to process an output of the thermal detector.

16. A thermal detection device comprising a plurality of the thermal detectors according to claim 1 arranged two-dimensionally.

17. The thermal detector according to claim 1, wherein the thermal detector is configured and arranged to detect infrared light.

18. The thermal detector according to claim 1, wherein the thermal detector is configured and arranged to detect terahertz light.

19. An electronic instrument comprising:
the thermal detector according to claim 1; and
a control part configured to process an output of the thermal detector.

20. A thermal detector manufacturing method comprising:
forming a structure including an insulating layer on a surface of a substrate,
removing at least a part of an uppermost layer of the structure and forming a concave part;
forming an etching stopper film on an inner surface of the concave part, and subsequently forming a sacrificial layer in the concave part;
forming a support member on the structure including the sacrificial layer;
forming a heat-detecting element on the support member;
forming a first light-absorbing layer on the heat-detecting element and the support member so as to be in contact with the heat-detecting element; and
forming a second light-absorbing layer on the first light-absorbing layer so as to be in contact with the first light-absorbing layer, the second light-absorbing layer having a higher refractive index than that of the first light-absorbing layer,
the forming of the first light-absorbing layer and the forming of the second light-absorbing layer including forming the first and second light-absorbing layers so that
a thickness obtained by adding a thickness of the first light-absorbing layer and a thickness of the second light-absorbing layer is a thickness that satisfies a relationship $m \cdot (\lambda 1/4)$, where m is an integer equal to or greater than 1 and $\lambda 1$ is a first wavelength, and
the thickness of the second light-absorbing layer is a thickness that satisfies a relationship $n \cdot (\lambda 2/4)$, where n is an integer equal to or greater than 1 and $\lambda 2$ is a second wavelength.

* * * * *